United States Patent [19]

Sasano et al.

[11] 4,395,629
[45] Jul. 26, 1983

[54] SOLID-STATE COLOR IMAGER AND METHOD OF MANUFACTURING THE SAME

[75] Inventors: Akira Sasano; Toshio Nakano, both of Hinodemachi; Ken Tsutsui, Hachioji; Michiaki Hashimoto, Yono; Tadao Kaneko, Hinodemachi; Yoshio Taniguchi, Hino; Haruo Matsumaru, Hinodemachi; Akiya Izumi, Mobara, all of Japan

[73] Assignee: Hitachi, Ltd., Tokyo, Japan

[21] Appl. No.: 215,073

[22] Filed: Dec. 10, 1980

[30] Foreign Application Priority Data

Dec. 10, 1979 [JP] Japan ............... 54-169848[U]

[51] Int. Cl.³ .............................................. G01J 3/34
[52] U.S. Cl. .................................... 250/226; 250/578; 350/166
[58] Field of Search ............... 250/226, 211 J, 578; 357/24 LR, 31, 32; 350/166, 313

[56] References Cited

U.S. PATENT DOCUMENTS 3,771,857 11/1973 Thomasson et al. ............ 350/166
4,029,394 6/1977 Araki ............................... 350/166
4,081,277 3/1978 Brault et al. .................... 250/226

Primary Examiner—David C. Nelms
Attorney, Agent, or Firm—Antonelli, Terry & Wands

[57] ABSTRACT

According to a solid-state imager of this invention, in case where a plurality of color filters are disposed on a semiconductor body for the solid-state imager including a plurality of photosensitive regions and where the color filter of a third color is constructed by the overlapping between filter members of a first color and a second color, that one of the filter members which has a spectral transmittance substantially transmitting light for exposure for use in forming the filter members is arranged as a lower layer closer to a substrate of the semiconductor body. Even when the filter members are formed by the exposure process, a solid-state imager having good characteristics can be manufactured.

17 Claims, 6 Drawing Figures

SOLID-STATE COLOR IMAGER AND METHOD OF MANUFACTURING THE SAME

BACKGROUND OF THE INVENTION

This invention relates to solid-state color imagers, and more particularly to a solid-state color imager provided with color filters.

Recently, as VTRs for industrial or domestic use have come into wide use, the demand for television cameras which are small in size, light in weight and easy of handling has risen. Therefore, notice has been taken of a solid-state television camera employing a semiconductor integrated circuit (in general, IC or LSI). The solid-state television camera is such that the faceplate and the electron beam generating portion of a conventional image pickup tube are substituted by an IC body and form an independent solid-state imager. Since the solid-state television camera uses no electron beam, it is superior to the image pickup tube in the points of high stability, low power dissipation, convenient handling, etc., and it is expected as the television camera of the coming generation.

The solid-state imager has a color filter portion stacked on a semiconductor body portion.

In case of using complementary color filters as the color filters, it is common practice to employ a system in which colors are reproduced with the four sets of cyan, yellow, green and white. In that case, green is produced by the overlapping parts of the filters of cyan and yellow.

In general, the filters are made of an organic material such as gelatine and polyvinyl alcohol. The material is applied onto the semiconductor body, and it is exposed to light through a mask and then developed to be patterned. Thereafter, the dye accepting material for the filter is dyed by immersing it in a predetermined dye liquor. After the filter of the first color has been formed, it is covered with an organic material which is not dyed with a dye liquor, and the same steps are repeated, whereby the filter of the second color is formed.

In this case, the spectral transmittance of the filter greatly varies depending upon the thickness of the layer of the dye accepting material for the filter. In order to realize a good color filter, accordingly, the layer of the filter dye accepting material needs to be formed to a precise thickness. However, in case where the layer of the filter dye accepting material is produced by utilizing a photosensitivity bestowed on the filter dye accepting material as described above, the thickness of the layer of the filter dye accepting material is determined by the quantity of the light in the exposure of the pattern of the filter dye accepting material.

In case where the color filter portion is formed directly on the solid-state imager by such method, reflected light from the surface of a substrate becomes a serious problem in contrast to cases of forming ordinary color filters. This is because the substrate of the solid-state imager reflects a large quantity of light unlike a transparent substrate of glass or the like.

In case of performing the exposure on the solid-state imager, the quantity of light in the exposure is determined by the sum between light entering directly from a light source and light reflected from the substrate surface. Accordingly, when the color filter absorbing irradiation light such as ultraviolet radiation (for example, the color filter of yellow) is formed for the first color and the color filter of cyan is formed for the second color above the color filter of the first color, the filter dye accepting material for cyan receives a smaller quantity of light in its part overlying the yellow filter than in its other part on the supposition that the underlying substance is Si. When the filter dye accepting material, for example, gelatine is used with the quantity of light saturated, a pattern of high precision cannot be formed on account of increased fogging. It is accordingly the most suitable to expose the parent material to a quantity of light immediately before the saturation. At this time, regarding the above example, the thickness of the layer of gelatine undergoes a difference of about 30% between the part overlying the yellow filter and the other part. As a result, a spectral transmittance of the color filter becomes a characteristic curve whose longer wavelength side is further shifted towards longer wavelengths. That is, the spectral transmittance in which green is shifted onto the longer wavelength side is obtained. With the color filter having such spectral transmittance, imaging results in a picture of extremely inferior color reproducibility.

An example in which filters are formed directly of a semiconductor substrate having photosensitive portions is known from "Technical Digest of International Electron Device Meeting", December 1976, p. 400.

SUMMARY OF THE INVENTION

An object of this invention is to provide a solid-state imager which carries an optically favorable color filter thereon.

The essential feature of a solid-state imager according to this invention consists in that, in case where a plurality of color filters are carried on a body for the solid-state imager including a plurality of photosensitive regions and where the color filter of a third color is constructed by the overlapping between filter members of a first color and a second color, that one of the filter members which has a spectral transmittance substantially transmitting light for exposure for use in forming the filter members is arranged as the filter member to be formed as a lower layer closer to a substrate of the body.

In general, the filter member of the first color is formed in such a way that a photosensitive film is formed by coating the body for the solid-state imager with a photosensitive solution which is gelatine or the like endowed with a photosensitivity, whereupon the photosensitive film is exposed to light by the mask exposure and then developed. Subsequently, this filter member is dyed and is covered with a transparent intermediate layer, and the same steps as described above are repeated, whereby the filter member of the second color is formed. (Such processes for forming filter members have been disclosed in Japanese Patent Applications Nos. 54-126844 and 54-107262.)

Even with the manufacturing processes referred to above, color filters of good spectral transmittances can be produced as long as the construction of the color filters as in this invention is used.

DETAILED DESCRIPTION OF THE PREFERRED EMBODIMENTS

Figure 1A:
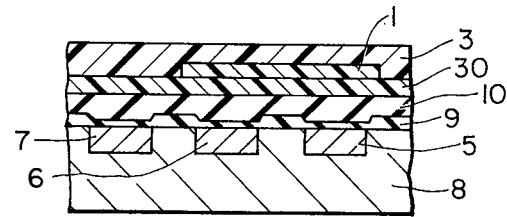
FIGS. 1a, 1b and 1c are sectional views of a solid-state imager showing the manufacturing steps of the imager.
Figure 1B:
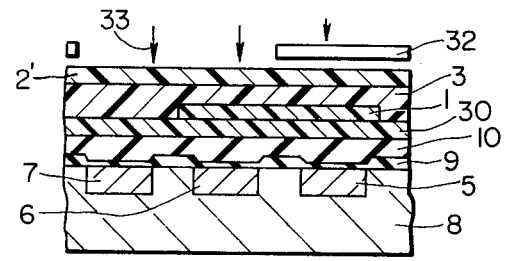
Figure 1C:
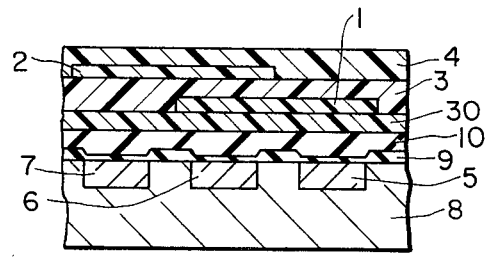

FIG. 1c is a schematic sectional view of a solid-state color imager which is an embodiment of this invention.

Photosensitive regions 5, 6 and 7 of the n-conductivity type which are 0.1–2 μm are formed in a Si substrate 8 of the p-conductivity type. Further, an oxide film 9 which is 5,000 Å–1 μm thick is formed on the substrate 8 and the photosensitive regions 5–7. On the resultant semiconductor body, an insulating layer 10 made of silane ($SiO_2$) is formed as a passivation film to a thickness of 0.5–2 μm. The passivation layer 10 is overlaid with a protection layer 30 which is made of polyglycidyl methacrylate (abbreviated to "PGMA") and which is 0.5–1 μm thick. In this manner, the semiconductor body for the solid-state color imager is constructed. Further, a cyanic color filter member 1 which is 0.5–1 μm thick and which has a predetermined pattern is formed on that area of the protection layer 30 which corresponds to the photosensitive regions 5 and 6. A color mixture-preventive protection layer 3 which is 0.5–1 μm thick is formed around and on the filter member 1. This protection layer 3 is usually termed an "intermediate layer". Further, a yellow color filter member 2 which is 0.5–1 μm thick and which has a predetermined pattern is formed on that area of the color mixture-preventive protection layer 3 which corresponds to the photosensitive regions 6 and 7. A protection layer 4 which is 0.5–1 μm thick is formed around and on the filter member 2. If necessary, an antireflection layer may well be formed on the protection layer though not shown in the figure.

As described above, over the photosensitive region 5 corresponding to the cyanic color, the cyanic color filter member 1 is correspondingly disposed. Over the photosensitive region 6 corresponding to the color green, the cyanic color filter member 1 and the yellow color filter member 2 are disposed in an overlapping fashion. Over the photosensitive region 7 corresponding to the color yellow, the yellow color filter member 2 is correspondingly disposed.

Figure 2:
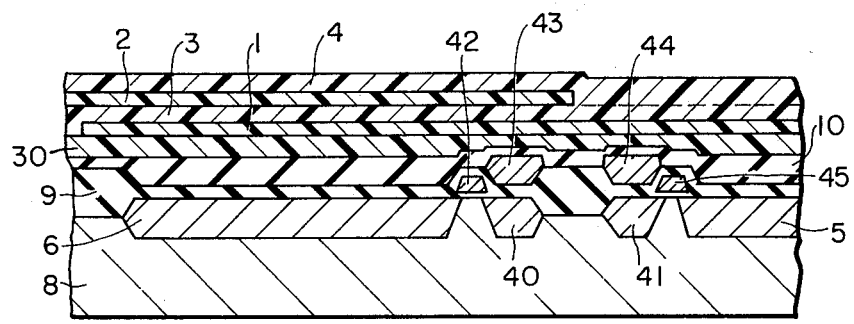
FIG. 2 is an enlarged sectional view of a picture element portion.

FIG. 2 is a partial enlarged view of and near the photosensitive region 6 for green in FIG. 1c. The switching portions of MOS type transistors are also shown. The same numerals as in FIG. 1c indicate the same parts. Numerals 40 and 41 designate drains for signal outputs of the color green and the cyanic color, respectively, numerals 43 and 44 signal output lines, and numerals 42 and 45 gates. The MOS type transistor portions are quite the same as conventional ones.

Figure 3:
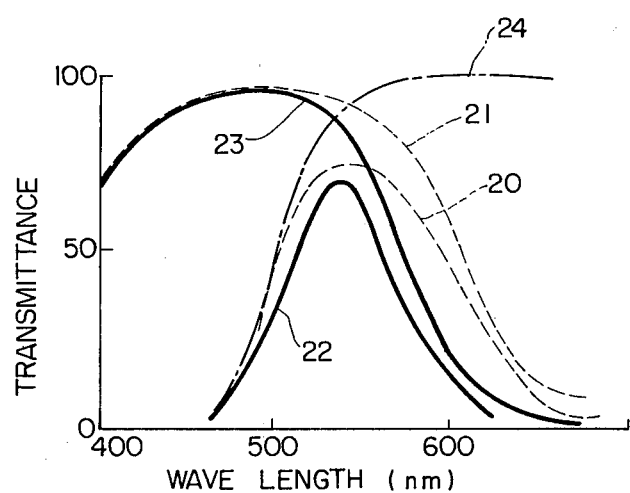
FIG. 3 is a graph showing the spectral transmission factors of filters.

FIG. 3 is a graph showing the spectral transmission factors of color filters, and illustrates for comparison's sake the color filters in the case where this invention is applied and in the case where it is not applied. The axis of abscissas represents the wavelength of light, while the axis of ordinates represents the transmittance in percent.

A curve 23 indicates the spectral transmission factor of a cyanic color filter, and a curve 24 that of a yellow color filter. Now, let's consider a case where a yellow color filter member is formed as a lower layer and a cyanic color filter member as an upper layer and where the overlapping parts of the color filter members are used for green. As light for exposure for forming filter members, ultraviolet radiation or visible ray (for example, light of a wavelength of 435 nm within the visible region) is usually used. In this case, the yellow color filter member does not transmit the exposure light in view of the spectral transmittance thereof. Accordingly, the layer of the cyanic color filter member arranged for obtaining a green color filter member becomes thin. As a result, the spectral transmission factor of the cyanic color filter member becomes as indicated by a curve 21. In consequence, the green color filter member composed of the yellow color filter member indicated by the curve 24 and the cyanic color filter member indicated by the curve 21 exhibits a spectral transmission factor as shown at a curve 20.

In this case, the part of the cyanic color filter member for obtaining the cyanic color has the characteristic of the curve 23 in FIG. 3, whereas the part presenting the cyanic color as arranged for obtaining the color green has the characteristic of the curve 21.

In reproducing the colors, the following subtractive color mixture of the three primary colors is relied on:

Cy (cyan)=B (blue)+G (green)
Ye (yellow)=G (green)+R (red)
G (green)

As stated above, however, green which is one of the three primary colors presents the characteristic which cannot be matched with the other primary colors. Accordingly, when the subtractive color mixture is executed, the colors R, G and B cannot be displayed as desired.

On the other hand, in case where as in this invention, the cyanic color filter member transmitting the exposure light is disposed as the lower layer and the yellow color filter member is disposed as the upper layer so as to obtain the green color filter member, this green color filter member possesses a characteristic curve 22 in FIG. 3.

In case where the cyanic color filter member has been arranged as the lower layer, the dye accepting material for the filter member to overlie the cyanic color filter member is subjected to a predetermined exposure. Then, the filter member having a desired thickness is formed. As a result, not only the part of the cyanic color filter member for presenting the cyanic color, but also the part thereof for obtaining the color green has the characteristic of the curve 23 in FIG. 3. Accordingly, the combined green color filter member has the desired characteristic of the curve 22.

That is, by arranging as the lower layer the filter member which substantially transmits the exposure light, the thickness of the layer of the filter member to be formed over the lower layer filter member in the overlapping fashion can be made the desired value.

If the filter member transmits at least 50% of the exposure light, it can achieve an effect to that extent.

In the above, the primary colors in the subtractive color mixture employing cyan and yellow have been exemplified. However, it goes without saying that the present invention is effective also in case of producing a third color by combining color filters of other colors.

As the fundamentals of procedures for manufacturing the color filters, the prior-art method can be satisfactorily employed as it is.

FIGS. 1a–1c show schematic process diagrams of a manufacturing method.

As shown in FIG. 1a, over a semiconductor substrate 8 for a solid-state imager having at least photosensitive regions 5, 6 and 7, a protection layer 30 is formed of polyglycidyl methacrylate or the like to a thickness of 0.5–1 μm. An oxide layer 9 and an organic material layer 10 which serve for passivation are as explained before.

A photosensitive solution in which polyvinyl alcohol, glue, gelatine or the like is endowed with a photosensitivity is uniformly applied onto the protection layer 30, and it is dried to form a photosensitive film to a thickness of 0.5–1 μm. The application of the photosensitive solution suffices with the spin coating. Subsequently, that part of the photosensitive film which corresponds to the photosensitive region of the cyanic color being a first color and the photosensitive region of the color green is photo-hardened by the mask exposure process, it is developed, and the other part of the photosensitive film is removed. The exposure is carried out with, for example, light having a wavelength of 435 nm. The resultant layer for a cyanic color filter member 1 is dyed with a dye liquor having a predetermined spectral transmittance (an aqueous solution containing 2.2% of "Cibacron Turquoise blue"), and the cyanic color filter member 1 is covered with a transparent intermediate layer 3. Subsequently, likewise to the above, as shown in FIG. 1b, the photosensitive solution is uniformly applied to form a photosensitive film 2′, whereupon it is exposed to the light by the mask exposure and then developed so as to form a portion of a second color extending over the photosensitive region of the color yellow and the photosensitive region of the color green. Numeral 32 in FIG. 1b indicates a mask for the exposure, and numeral 33 the light for the exposure. That part of the photosensitive film 2′ which overlies the photosensitive region 7 of yellow is exposed to the direct light from an exposure light source and reflected light from the surface of the semiconductor body. That part of the photosensitive film 2′ which corresponds to the photosensitive region 6 of green is similarly exposed to the direct light and the reflected light from the semiconductor body surface. More specifically, when the reflected light is considered, the cyan filter intervenes between the photosensitive film 2′ and the semiconductor body surface. Since the cyan filter transmits the exposure light satisfactorily in practical use, the photosensitive layer 2′ is exposed to the light substantially uniformly over the parts corresponding to the photosensitive regions 7 and 6. Accordingly, the photosensitive layer 2′ developed has a substantially uniform thickness.

Subsequently, the developed layer for a yellow color filter member 2 is dyed with a dye liquor having a predetermined spectral transmittance (an aqueous solution containing 0.7% of "Kayanol Yellow" (trade name)), and the yellow color filter member 2 is covered with a protection layer 4 (refer to FIG. 1c).

Owing to such stacked structure in which the yellow color filter member 2 is formed over the cyanic color filter member 1, the light for the exposure can be used without the shortage of the quantity thereof even when the color filter members have the overlapping parts.

In addition, since the reflected light from the substrate can also be effectively used for the exposure, the quantity of the illumination light to enter directly need not be increased unnecessarily. This is convenient for preventing the occurrence of fogging, and permits the formation of a pattern of high precision.

Figure 4:
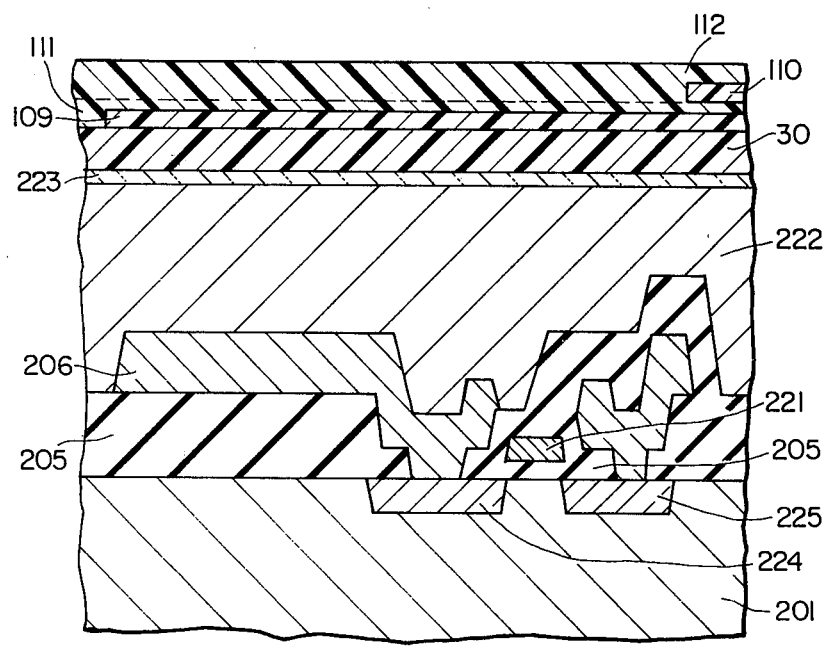
FIG. 4 is a sectional view of an image showing another embodiment.

FIG. 4 is a schematic sectional view of one picture element portion of a solid-state imager which is still another embodiment of this invention.

This solid-state imager employs a photoconductive thin film as a photosensitive portion. A Si substrate 201 is formed therein with impurity regions 224 and 225, on which a gate electrode 221 is arranged through an insulating film 205.

A large number of switching elements thus constructed are arranged in a plane. A photoconductive thin film 222 is disposed over the switching elements, and is overlaid with a transparent electrode 223.

This invention is quite similarly applicable to such solid-state imager wherein on the Si substrate which includes a switching circuit made up of the switching elements formed of PN-junctions, the photoconductive thin film made of chalcogen glass or the like is formed as photoelectric conversion elements.

Shown at 206 is an electrode which is connected to the source of the vertical MOS switch. The photoconductive thin film 222 is conductive to the electrode 206, but it is insulated from the gate electrodes 221 through the oxide film 205. The diffused layer 224 serves to lead out the electrode 206, and corresponds to the source of the vertical MOS switch. The electrode 206 forms a capacitance proportional to its area between it and the transparent conductive thin film 223 through the photoconductive thin film 222. Since the electrode pattern is separated into the shape of a matrix, such capacitances are arranged in the shape of the matrix. Since the capacitances hold the photoconductive thin film therein, they function as photosensitive elements and form picture elements.

For the photoconductive thin film, substances exhibiting photoconductivities such as Se-Te-As amorphous semiconductors, $Sb_2S_3$, CdS, $As_2Se_3$ and polycrystalline Si and amorphous Hydrogenated Si are similarly employed.

Even in case where color filters are to be placed directly on the semiconductor body for such solid-state imager, they can be constructed in quite the same way as in the foregoing examples.

Numeral 30 designates a protection layer as described before, numeral 109 a filter member of, e.g., the cyanic color, numeral 110 a filter member of the color yellow, numeral 111 an intermediate layer, and numeral 112 a protection film of the uppermost layer.

The method of manufacturing the filters is quite the same as in the foregoing examples, and is not repeatedly explained.

What is claimed is:

1. A solid-state color imager having at least a semiconductor body which includes a plurality of sets of photosensitive regions therein, and color filter members which are arranged on the semiconductor body in correspondence with the photosensitive regions, said color filter members being formed by exposing desired areas of photosensitive films for color filter members to light and then developing said films into a layer in a desired shape for the colored filter members, the color filter members having at least two sorts of spectral transmittances different from each other, a third spectral transmittance to correspond to one of the photosensitive regions in each set being produced by combining the spectral transmittances of the first and second filter members; characterized in that the first and second filter members with respective first and second spectral transmittances are disposed at different levels above said semiconductor body, and the filter member exhibiting the spectral transmittance which substantially transmits the light to which the photosensitive films are exposed is arranged as a lower layer of the first and second filter members.

2. A solid-state color imager according to claim 1, wherein said light to which the photosensitive films are exposed is substantially ultraviolet radiation, and said filter member arranged as said lower layer has the spectral transmittance which substantially transmits the ultraviolet radiation.

3. A solid-state color imager according to claim 2, wherein said filter member arranged as said lower layer is cyanic and has the spectral transmittance which substantially transmits the ultraviolet radiation, while the filter member arranged as an upper layer is yellow.

4. A solid-state color imager according to any of claims 1 to 3, wherein said plurality of sets of photosensitive regions included in said semiconductor body are constructed as a plurality of sets of impurity regions which are disposed in a semiconductor substrate.

5. A solid-state color imager according to any of claims 1 to 3, wherein said plurality of sets of photosensitive regions included in said semiconductor body have a photoconductive layer which is disposed on a semiconductor substrate.

6. A solid-state color imager according to any of claims 1 to 3, wherein a light-transmitting polymer resin layer is disposed on an upper surface of said semiconductor body and is overlaid with at least the color filter members.

7. A solid-state color imager according to claim 1, wherein said first and second filter members overlap to provide said third spectral transmittance.

8. A solid-state color imager according to claim 1, wherein said photosensitive films are made of a photosensitive organic material which accepts dyes for forming said color filter members.

9. A solid-state color imager according to claim 8, wherein said photosensitive organic material includes polyvinyl alcohol or gelatine.

10. A solid-state color imager according to claim 6, wherein an intermediate layer is formed around and on each of said color filter members.

11. A method of manufacturing a solid-state color imager comprising the steps of forming a photosensitive film for a color filter member on a semiconductor body, said semiconductor body including a plurality of sets of photosensitive regions, exposing a desired area of the photosensitive film to light and then developing it into a layer in a desired shape for the color filter member, endowing the layer for the color filter member with a predetermined spectral transmittance to finish the color filter member, and covering the color filter member with a light-transmitting intermediate layer, the operations being repeated to successively form color filter members which have predetermined spectral transmittances respectively, a protective layer being disposed as an uppermost layer, the color filter members having at least two sorts of spectral transmittances different from each other, the color filter member exhibiting the first spectral transmittance being overlaid with the color filter member exhibiting the second spectral transmittance, a third spectral transmittance being produced by combining the first and second spectral transmittances; characterized in that, in forming the first and second filter members with the respective first and second spectral transmittances, the filter member exhibiting the spectral transmittance which substantially transmits said light for exposing the desired area of the photosensitive film is arranged as a lower layer of the first and second filter members.

12. A method of manufacturing a solid-state imager according to claim 11, wherein said light for exposing the desired area of the photosensitive film is substantially ultraviolet radiation, and said filter member arranged as said lower layer has the spectral transmittance which substantially transmits the ultraviolet radiation.

13. A method of manufacturing a solid-state color imager according to claim 12, wherein said filter member arranged as said lower layer is cyanic and has the spectral transmittance which substantially transmits the ultraviolet radiation, while the filter member arranged as an upper layer is yellow.

14. A method of manufacturing a solid-state color imager according to claim 11, wherein said photosensitive film is made of a photosensitive organic material which accepts dyes for forming the color filter member.

15. A method of manufacturing a solid-state color imager according to claim 14, wherein said photosensitive organic material includes polyvinyl alcohol or gelatine.

16. A method of manufacturing a solid-state color imager according to claim 11, wherein said color filter members formed with different spectral transmittances are formed in correspondence with photosensitive regions, and wherein the third spectral transmittance produced by combining the first and second spectral transmittances is formed in correspondence with photosensitive regions.

17. A method of manufacturing a solid-state color imager according to claim 16, wherein said color filter members are formed in correspondence with photosensitive regions by being formed overlying said photosensitive regions.

* * * * *